United States Patent
Chao

(10) Patent No.: US 6,177,327 B1
(45) Date of Patent: Jan. 23, 2001

(54) METHOD OF MANUFACTURING CAPACITOR FOR MIXED-MODED CIRCUIT DEVICE

(75) Inventor: Yu-Feng Chao, Hsinchu (TW)

(73) Assignee: United Semiconductor Corp., Hsinchu (TW)

(*) Notice: Under 35 U.S.C. 154(b), the term of this patent shall be extended for 0 days.

(21) Appl. No.: 09/250,628

(22) Filed: Feb. 16, 1999

(30) Foreign Application Priority Data

Jan. 16, 1999 (TW) .................................. 88100646

(51) Int. Cl.[7] .................................. H01L 21/8242
(52) U.S. Cl. ............................................. 438/396
(58) Field of Search ............................ 438/253, 396, 438/FOR 220, FOR 430

(56) References Cited

U.S. PATENT DOCUMENTS 5,918,119 * 6/1999 Huang .
5,940,713 * 8/1999 Green .
5,966,600 * 10/1999 Hong .

* cited by examiner

*Primary Examiner*—George Fourson
*Assistant Examiner*—Joannie A. Garcia
(74) *Attorney, Agent, or Firm*—Jiawei Huang; J C Patents

(57) ABSTRACT

A method of manufacturing a capacitor for a mixed-mode circuit device. A substrate having an isolation region is provided. A bottom electrode is formed on the isolation region. A spacer is formed on a sidewall of the bottom electrode. A dielectric layer is formed on the bottom electrode. A conductive layer is formed over the substrate. The conductive layer is patterned to form an upper electrode.

7 Claims, 1 Drawing Sheet

METHOD OF MANUFACTURING CAPACITOR FOR MIXED-MODED CIRCUIT DEVICE

CROSS-REFERENCE TO RELATED APPLICATION

This application claims the priority benefit of Taiwan application serial no. 88100646, filed Jan. 16, 1999.

BACKGROUND OF THE INVENTION

1. Field of the Invention

The present invention relates to a method of manufacturing a semiconductor device. More particularly, the present invention relates to a method of manufacturing a capacitor for a mixed-mode circuit device.

2. Description of the Related Art

A mixed-mode circuit device typically includes a circuit comprising both digital and analog devices on a logic area of a semiconductor chip. The digital devices include inverters, adders, and the analog devices include amplifiers and analog-to-digital converters. The digital and analog devices further comprise elementary devices such as MOS transistors and capacitors.

Typically, the process for manufacturing the MOS transistor and the capacitor in the mixed-mode circuit device comprises the steps of forming an insulating layer on the substrate to define an active region of the MOS transistors. A field oxide layer is formed on the substrate to isolate the adjacent devices from each other. A patterned first conductive layer used as the bottom electrode of the capacitor is formed on the field oxide layer. Then, a thermal oxidation process is performed to simultaneously form a gate oxide layer on the active region and an oxide layer on the top surface and the sidewall of the patterned first conductive layer. Next, a second conductive layer is formed over the substrate. Thereafter, the second conductive layer is patterned to form a gate electrode on the gate oxide layer and an upper electrode of the capacitor on the oxide layer above the bottom electrode.

However, after the second conductive layer is patterned to finish the process for fabricating the capacitor, conductive residuals with a size of about 0.4–0.5 micrometers remain on the substrate around the bottom corner of the patterned first conductive layer, which is the bottom electrode. The conductive residuals lead to the bridging effect between two gates respectively belonging to two adjacent MOS transistors. Because of the bridging effect, the faulty operations of the devices easily occur, the functions of the devices fail and the yield is low.

Usually, in order to overcome the bridging problem caused by the conductive residuals, a relatively large allowance space between the MOS transistor and the capacitor in the mixed-mode circuit device according to the design rule is used to avoid the bridging effect. Nevertheless, the relatively large allowance space disrupts the enhancement of the integration of the devices and lead to the consumption of the wafer spaces.

Moreover, in a conventional mixed-mode circuit device, the capacitors are centrally formed in the same region on the wafer, so that the wires used to respectively electrically couple the capacitors and the MOS transistors are very long. This leads to the increase of the resistor capacitor time delay (RC time delay). In order to overcome the problem caused by the long wires, the capacitors are formed apart in the different region on the wafer to decrease the distance between the capacitors and the MOS transistors. Therefore, the length of the wires and the RC time delay can be reduced. Nevertheless, since the capacitors are formed apart in the different region on the wafer, the bridging effect between two adjacent gates due to the conductive residuals becomes more serious and the yield becomes lower. Additionally, the integration is greatly disrupted by the allowance spaces according to the design rule.

SUMMARY OF THE INVENTION

The invention provides a method of manufacturing a for a mixed-mode circuit device. By using the invention, the bridging effect caused by the conductive residuals can be overcome and the integration of the devices can be greatly increased.

To achieve these and other advantages and in accordance with the purpose of the invention, as embodied and broadly described herein, the invention provides a method of manufacturing a capacitor for a mixed-mode circuit device. A substrate having an isolation region and a device region having a MOS transistor is provided. A bottom electrode is formed on the isolation region. A spacer is formed on a sidewall of the bottom electrode. A dielectric layer is formed on the bottom electrode. A conductive layer is formed over the substrate. The conductive layer is patterned to form an upper electrode. Since the spacer is formed on the sidewall of the bottom electrode, the bridging effect caused by the conductive residuals can be eliminated. Moreover, the allowance spaces between the MOS transistor and the capacitor for the spacer in the mixed-mode circuit device according to the design rule are relatively small. Therefore, the integration of the devices is greatly increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawing.

DESCRIPTION OF THE PREFERRED EMBODIMENTS

Figure 1:
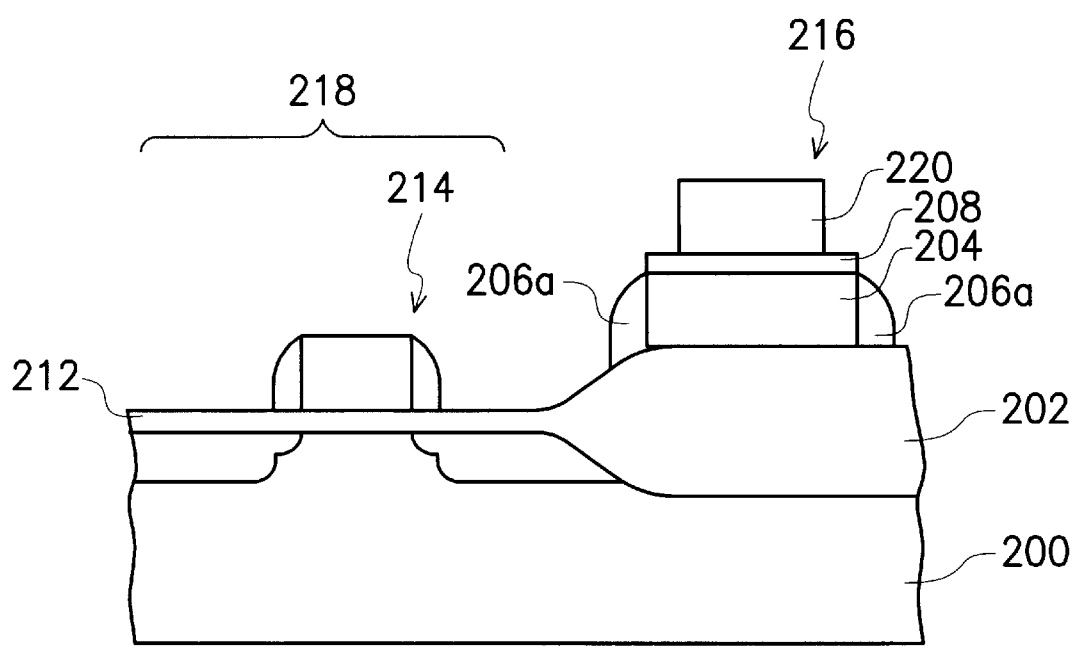
FIG. 1 is a schematic, cross-sectional view of a MOS transistor and a capacitor formed by the method according to the invention in a mixed mode circuit device.

Reference will now be made in detail to the present preferred embodiments of the invention, examples of which are illustrated in the accompanying drawing. Wherever possible, the same reference numbers are used in the drawings and the description to refer to the same or like parts.

As shown in FIG. 1, an isolation region 202 is formed on a substrate 200. The isolation region 202 can be a shallow trench isolation or a field oxide layer, for example. A patterned conductive layer 204 is formed on the isolation region 202. The thickness of the conductive layer 204 is about 2000 angstroms and the conductive layer 204 can be a doped polysilicon layer formed by chemical vapor deposition (CVD), for example. Preferably, the impurity dopant in the doped polysilicon layer can be introduced during or following deposition. The conductive layer 204 is used as a bottom electrode of a capacitor for the mixed-mode circuit device.

An insulating layer (not shown) is formed over the substrate 200 and covers the top surface and the sidewall of the conductive layer 204 and the isolation region 202. The insulating layer can be a silicon oxide layer or a silicon nitride layer formed by CVD, for example.

A portion of the insulating layer is removed to form a spacer 206a on the sidewall of the conductive layer 204. In this example, the method of removing the portion of the insulating layer can be dry etching and the preferred method can be anisotropic etching. A dielectric layer 208 is formed on the conductive layer 204. The thickness of the dielectric layer 208 is about 550 angstroms and the dielectric layer 208 can be a silicon oxide layer, for example. In this example, the dielectric layer 208 can be formed by thermal oxidation, and the top of the conductive layer 208 is oxidized to a thin silicon oxide layer.

A conductive layer 220 is formed over the substrate 200. The conductive layer 220 is patterned to expose a portion of the dielectric layer 208. The thickness of the conductive layer 220 is about 3000 angstroms and the conductive layer 220 can be a doped polysilicon layer formed by CVD, for example. Preferably, the impurity dopant in the doped polysilicon layer can be introduced during or following deposition. The conductive layer 220 is used as an upper electrode of a capacitor for the mixed-mode circuit device.

Further as shown in FIG. 1, a MOS transistor 214 and a capacitor 216 are respectively formed on a gate oxide layer 212 in the device region 218 and an isolation region 202 on a substrate 200 by the aforementioned method. Since the spacer 206a is formed on the sidewall of the bottom electrode 204, the bridging effect caused by the conductive residuals can be eliminated. Moreover, the allowance spaces between the MOS transistor and the capacitor for the spacer in the mixed-mode circuit device according to the design rule are relatively small. Therefore, the integration of the devices is greatly increased.

In the preferred embodiment according to the invention, since the spacer 206a is formed on the sidewall of the conductive layer 204, no conductive residuals remain on the substrate around the bottom corner of the conductive layer 204 when the conductive layer 220 is patterned to form the upper electrode. Hence, the bridging effect caused by the conductive residuals can be eliminated and the problems of the faulty operations of the devices and device failure can be overcome, so that the yield is enhanced. Additionally, comparing the spacer 206a with the conductive residual, the allowance spaces between the MOS transistor and the capacitor for the spacer 206a in the mixed-mode circuit device according to the design rule are relatively small. Therefore, the integration of the devices is greatly increased and the problem of the consumption of the wafer spaces can be solved.

The present invention includes the following advantages:

1. In the invention, since the spacer is formed on the sidewall of the bottom electrode, the conductive residuals do not remain on the substrate around the bottom corner of the bottom electrode. Hence, the bridging effect caused by the conductive residuals can be eliminated and the problems of the faulty operations of the devices and device failure can be overcome.

2. In the invention, the spacer is formed on the sidewall of the bottom electrode. Comparing the spacer with the conductive residuals, the allowance spaces between the MOS transistor and the capacitor for the spacer in the mixed-mode circuit device according to the design rule are relatively small. Therefore, the integration of the devices is greatly increased and the problem of the consumption of the wafer spaces can be solved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a capacitor for a mixed-mode circuit device suitable on a substrate having an isolation region and a device region, wherein a MOS transistor is to be formed on the device region, the method comprising the steps of:

forming a bottom electrode on the isolation region;

forming a spacer on a sidewall of the bottom electrode;

forming a dielectric layer on the top surface of the bottom electrode after forming the spacer;

forming a conductive layer over the substrate after the formation of the dielectric layer; and patterning the conductive layer to form an upper electrode.

2. The method of claim 1, wherein the step of forming the spacer further comprises the steps of:

forming an insulating layer over the substrate to cover a top surface and a sidewall of the bottom electrode and the isolation region; and removing a portion of the insulating layer to form the spacer on the sidewall of the bottom electrode.

3. The method of claim 2, wherein the method of removing the portion of the insulating layer includes anisotropic etching.

4. The method of claim 1, wherein material of the spacer includes silicon oxide.

5. The method of claim 1, wherein material of the spacer includes silicon nitride.

6. The method of claim 1, wherein the method of forming the dielectric layer includes thermal oxidation.

7. A method of manufacturing a capacitor for a mixed-mode circuit device, comprising the steps of:

providing a substrate having an isolation region and a device region, wherein a MOS transistor is to be formed on the device region;

forming a bottom electrode on the isolation region;

forming a spacer on a sidewall of the bottom electrode, so that only the top surface of the bottom electrode is exposed;

forming a dielectric layer on the exposed top surface of the bottom electrode; and forming an upper electrode on the dielectric layer on top of the bottom electrode.

* * * * *